United States Patent
Mosley et al.

[11] Patent Number: 5,821,457
[45] Date of Patent: Oct. 13, 1998

[54] SEMICONDUCTOR DIE CARRIER HAVING A DIELECTRIC EPOXY BETWEEN ADJACENT LEADS

[75] Inventors: Joseph M. Mosley; Maria M. Portuondo, both of Boca Raton, Fla.

[73] Assignee: The Panda Project, Boca Raton, Fla.

[21] Appl. No.: 902,032

[22] Filed: Jul. 29, 1997

Related U.S. Application Data

[63] Continuation of Ser. No. 487,100, Jun. 7, 1995, abandoned, which is a continuation-in-part of Ser. No. 208,586, Mar. 11, 1994, abandoned.

[51] Int. Cl.$^6$ .................................................. H01L 23/02
[52] U.S. Cl. .................... 174/52.4; 257/678; 361/772
[58] Field of Search ................... 174/52.4, 52.1; 257/696, 693, 694, 692, 691, 690, 678, 728, 723, 724, 308, 307, 528, 664, 773, 775, 673; 361/773, 772, 774, 775, 763, 761, 760, 777

[56] References Cited

U.S. PATENT DOCUMENTS

| | | | |
|---|---|---|---|
| 3,337,838 | 8/1967 | Damiano et al. | 339/217 |
| 3,366,915 | 1/1968 | Miller | 339/19 |
| 3,444,506 | 5/1969 | Wedekind | 339/99 |
| 3,676,748 | 7/1972 | Kobayashi et al. | |
| 3,676,993 | 7/1972 | Bergey et al. | 52/23 |
| 3,806,831 | 4/1974 | Kleinberg | 331/116 R |
| 4,167,647 | 9/1979 | Salera | 174/52 FP |
| 4,331,831 | 5/1982 | Ingram et al. | 174/52.4 |
| 4,423,468 | 12/1983 | Gatto et al. | 361/404 |
| 4,437,718 | 3/1984 | Selinko | 339/61 M |
| 4,487,463 | 12/1984 | Tillotson | 339/17 C |
| 4,572,604 | 2/1986 | Ammon et al. | 339/176 MP |
| 4,616,406 | 10/1986 | Brown | 29/588 |
| 4,655,526 | 4/1987 | Shaffer | 339/74 R |
| 4,660,069 | 4/1987 | Kochanski et al. | 357/68 |
| 4,675,472 | 6/1987 | Krumme et al. | 174/52.4 |
| 4,698,663 | 10/1987 | Sugimoto et al. | 357/81 |
| 4,705,917 | 11/1987 | Gates, Jr. et al. | 172/52.4 |
| 4,734,042 | 3/1988 | Martens et al. | 439/62 |
| 4,766,479 | 8/1988 | Krum et al. | 357/74 |
| 4,897,055 | 1/1990 | Jurista et al. | 439/924 |

(List continued on next page.)

FOREIGN PATENT DOCUMENTS

| | | |
|---|---|---|
| 0 104 051 | 3/1984 | European Pat. Off. . |
| 0 145 694 | 6/1985 | European Pat. Off. . |
| 0 155 044 | 9/1985 | European Pat. Off. . |
| 0 438 165 | 7/1991 | European Pat. Off. . |
| 0 467 698 | 1/1992 | European Pat. Off. . |
| 0 600 750 A3 | 6/1994 | European Pat. Off. . |

(List continued on next page.)

OTHER PUBLICATIONS

IBM Technical Disclosure Bulletin, vol. 32, No. 10A Mar. 1990, pp. 85–86, Jan. 1996.
Dimensional Circuits Corporation, Dimensional Circuits Corp. Awarded Two U.S. Patents, D.C.C. News, Apr. 5, 1994.
Robert Barnhouse, "Bifurcated Through–Hole Technology—An Innovative Solution to Circuit Density," Connection Technology, pp. 33–35 (Feb., 1992).
"AMP–ASC Interconnection Systems," AMP Product Information Bulletin, pp. 1–4 (1991).

(List continued on next page.)

*Primary Examiner*—Kristine L. Kincaid
*Assistant Examiner*—Kristina Soderquist
*Attorney, Agent, or Firm*—Morgan, Lewis & Bockius LLP

[57] ABSTRACT

A semiconductor die carrier includes an insulative module; a plurality of electrically conductive leads extending from the insulative module; a semiconductor die housed with the insulative module; and at least one high frequency capacitor secured to the insulative module for facilitating transmission of high frequency signals carried to and from the semiconductor die on the electrically conductive leads.

10 Claims, 14 Drawing Sheets

U.S. PATENT DOCUMENTS

| | | | |
|---|---|---|---|
| 4,931,908 | 6/1990 | Boucard et al. | 361/395 |
| 4,943,846 | 7/1990 | Shirling | 357/80 |
| 4,975,066 | 12/1990 | Sucheski et al. | 439/63 |
| 4,989,318 | 2/1991 | Utunomiya et al. | 29/827 |
| 4,997,376 | 3/1991 | Buck et al. | 439/59 |
| 5,008,734 | 4/1991 | Dutta et al. | |
| 5,022,144 | 6/1991 | Hingorary | 29/854 |
| 5,037,311 | 8/1991 | Frankeny et al. | 439/66 |
| 5,049,974 | 9/1991 | Nelson et al. | |
| 5,071,363 | 12/1991 | Reylek et al. | 439/291 |
| 5,081,563 | 1/1992 | Feng et al. | 361/414 |
| 5,091,772 | 2/1992 | Kohara et al. | |
| 5,123,164 | 6/1992 | Shaheen et al. | 29/852 |
| 5,137,456 | 8/1992 | Desai et al. | 439/66 |
| 5,138,438 | 8/1992 | Masayuki et al. | |
| 5,182,853 | 2/1993 | Kobayashi et al. | 29/841 |
| 5,220,491 | 6/1993 | Sugano et al. | 361/412 |
| 5,281,151 | 1/1994 | Arima et al. | 439/68 |
| 5,281,851 | 1/1994 | Mills et al. | 257/670 |
| 5,283,717 | 2/1994 | Hundt | 361/813 |
| 5,285,104 | 2/1994 | Kondo et al. | 257/666 |
| 5,309,024 | 5/1994 | Hirano | 257/773 |
| 5,326,936 | 7/1994 | Taniuchi et al. | 174/260 |
| 5,327,325 | 7/1994 | Nicewarner, Jr. | 361/760 |
| 5,331,514 | 7/1994 | Kuroda | 361/760 |
| 5,334,279 | 8/1994 | Gregoire | 156/630 |
| 5,342,999 | 8/1994 | Frei et al. | 174/266 |
| 5,344,343 | 9/1994 | Seidler | 439/876 |
| 5,347,429 | 9/1994 | Kohno et al. | 361/813 |
| 5,351,393 | 10/1994 | Gregoire | 29/835 |
| 5,371,404 | 12/1994 | Juskey et al. | 257/659 |
| 5,376,825 | 12/1994 | Tukamoto et al. | 257/685 |
| 5,390,412 | 2/1995 | Gregoire | 29/848 |
| 5,403,784 | 4/1995 | Hashemi et al. | 437/217 |
| 5,422,514 | 6/1995 | Griswold et al. | 257/679 |
| 5,428,505 | 6/1995 | Sakemi et al. | 361/777 |
| 5,438,224 | 8/1995 | Papageorge et al. | 257/777 |
| 5,543,586 | 8/1996 | Crane, Jr. et al. | 174/262 |
| 5,696,027 | 12/1997 | Crane, Jr. et al. | 438/182 |

FOREIGN PATENT DOCUMENTS

| | | | |
|---|---|---|---|
| 2664097 | 1/1992 | France . | |
| 3337796 | 4/1985 | Germany . | |
| 3430849A1 | 3/1986 | Germany . | |
| 3737819A1 | 5/1988 | Germany . | |
| 4021872 | 1/1992 | Germany . | |
| 58-66344 | 4/1983 | Japan . | |
| 60-28256 | 2/1985 | Japan . | |
| 60-254641 | 12/1985 | Japan . | |
| 62-21249 | 1/1987 | Japan . | |
| 62-81739 | 4/1987 | Japan . | |
| 62-248243 | 10/1987 | Japan . | |
| 1-74795 | 3/1989 | Japan . | |
| 1-205456 | 8/1989 | Japan . | |
| 2-156558 (A) | 6/1990 | Japan | H01L 23/50 |
| 2-301182 | 12/1990 | Japan . | |
| 3-151686 | 6/1991 | Japan | 257/695 |
| 4-72750 | 3/1992 | Japan . | |
| 4-147660 | 5/1992 | Japan . | |
| 4-237154 | 8/1992 | Japan . | |
| 5-226803 | 9/1993 | Japan . | |
| 361005549 | 1/1996 | Japan | 257/659 |
| 1245710 | 9/1971 | United Kingdom . | |
| 2 174 538 | 11/1986 | United Kingdom . | |
| 2 196 178 | 4/1988 | United Kingdom . | |

OTHER PUBLICATIONS

"Micro–Strip Interconnection System," AMP Product Guide, pp. 3413–3414 (Jun., 1991).

"Rib–Cage II Through–Mount Shrouded Headers" and Micropax Board–to–Board Interconnect System, Du Pont Connector Systems Product Catalog A, pp. 2–6, 3–0, 3–1 (Feb., 1992).

R.R. Tummala et al., "Microelectronics Packaging Handbook," Van Nostrand Reinhold, 1989, pp. 38–43, 398–403, 779–791, 853–859, and 900–905.

"Packing," Intel Corporation, 1993, pp. 2–36, 2–96, 2–97, 2–100, 3–2, 3–24, and 3–25.

J.W. Balde et al., "New Chip Carrier Package Concepts," Computer, Productivity and Automation, IEEE Computer Society, vol. 10, pp. 58–68, (Dec., 1977).

SEMICONDUCTOR DIE CARRIER HAVING A DIELECTRIC EPOXY BETWEEN ADJACENT LEADS

CROSS-REFERENCE TO RELATED APPLICATIONS

This application is a continuation, of application Ser. No. 08/487,100, filed Jun. 7, 1995 now abandoned; which is a continuation-in-part of U.S. Ser. No. 08/208,586; filed Mar. 11, 1994, now abandoned.

BACKGROUND OF THE INVENTION

1. Field of the Invention

The present invention relates to a high performance, peripherally-leaded, semiconductor chip or die carrier having a reduced size and including an internal voltage and/or ground plane and/or at least one high frequency capacitor, and methods for making and using the semiconductor die carrier. In a preferred embodiment, the semiconductor die carrier has horizontally and vertically spaced rows of multiple leads, with each lead being assembled into the semiconductor die carrier as an individually manufactured lead rather than a sub-element of a lead frame, and the high frequency capacitor enhances high frequency performance and carries out noise reduction with respect to the die carrier.

2. Description of the Related Art

Conventional package leads are typically configured for mounting using plated-through-hole (PTH) technology or surface-mount technology (SMT). In PTH technology, a conductive PTH is formed in a printed circuit board (PCB). Each lead of a package is inserted through a corresponding PTH and then soldered to form a solder joint fastening the lead in conductive contact with the PTH. In SMT mounting, each lead of a package, rather than being soldered to extend through a PTH in a PCB, is soldered onto a conductive portion of a top surface of the PCB. A solder joint then maintains each lead of the leaded die carrier, in a fastened relationship with respect to the PCB.

One type of SMT package is known as a QFP (Quad Flat Package). QFPs are typically manufactured using a molded plastic technology.

Multi-row lead configurations are also known. For example, it is known to provide two rows of leads, formed by using two different lead frames vertically spaced and insulated from each other, extending from sides of a QFP. It is also known to provide rows of multiple leads formed using vertically spaced lead frames with adjacent rows of leads primarily separated from each other by a gaseous dielectric such as air.

The aforementioned semiconductor die packages suffer from many deficiencies. For example, the molded plastic technology typically used to manufacture QFPs incorporates various processes following the wire bonding procedure which can have detrimental effects on the bonding integrity. Moreover, the use of lead frames during the manufacturing of QFP semiconductor packages and the like also results in numerous disadvantages.

The aforementioned semiconductor die packages are also typically incapable of handling high frequency signals (e.g., 50–110 ns) in a satisfactory manner. Typically, semiconductor die packages which attempt to handle high frequency signals experience problems for at least the following reasons: (1) transmission line impedance discontinuities and very low numbers relative to the PCB; (2) long propagation delay (for a 12 mm chip the connection could be as long as 17 mm, for example); (3) delta I type signal degradation or noise (including ground bounce and power supply droop effects); and (4) ground bounce caused by high ground inductance. These factors can render conventional semiconductor die packages incapable of maintaining the edge rate and edge integrity of the high frequency signals.

From the foregoing, it can be understood that conventional semiconductor packages are incapable of adequately handling high frequency signals and, especially when attempting to handle high frequency signals, are limited in performance due to signal degradation resulting from noise; take up large amounts of board space; are expensive and often experience difficulties during manufacture; perform insufficiently due to procedures carried out after chip attachment and wire bonding that tend to inhibit bond integrity; and, after manufacture, are difficult, if not impossible, to repair. As a result of such limitations, current semiconductor packaging technology is not sufficient to meet the needs of existing and/or future semiconductor and computer technology. Semiconductor packaging technology has already failed to keep pace with silicon die technology, and as computer and microprocessor speeds continue to climb, with space efficiency being increasingly important, semiconductor die packages having even smaller area requirements will be required. The semiconductor die packages discussed above fall short of current and contemplated semiconductor and computer requirements.

SUMMARY OF THE INVENTION

Accordingly, it is a goal of the present invention to provide a prefabricated semiconductor die carrier capable of handling high frequency signals while, at the same time, minimizing effects resulting from noise, occupying reduced amounts of board area, providing an increased number of contacts, and being capable of meeting the needs of existing and contemplated semiconductor and computer technology.

Another goal of the present invention is to provide a semiconductor die carrier manufactured without the use of lead frames and having leads extending from side portions thereof suitable for mounting using PTH technology, SMT methodology, or pluggable mounting.

Still another goal of the present invention is to provide a semiconductor die carrier that is fabricated and tested prior to placement of a semiconductor die within the carrier, thereby increasing final packaging yields and reducing total unit cost.

It is also a goal of the present invention to provide methods for making and using semiconductor die carriers having characteristics such as those discussed above.

These and other goals may be achieved by using a semiconductor die carrier comprising an insulative module; a plurality of electrically conductive leads extending from the insulative module; a semiconductor die housed with the insulative module; and at least one high frequency capacitor secured to the insulative module for facilitating transmission of high frequency signals carried to and from the semiconductor die on the electrically conductive leads.

It is to be understood that both the foregoing general description and the following detailed description are exemplary and explanatory, and are not restrictive of the invention as claimed. The accompanying drawings, which are incorporated in and constitute a part of the specification, illustrate embodiments of the present invention and, together with the general description, serve to explain the principles of the present invention.

DESCRIPTION OF EXEMPLARY EMBODIMENTS

Figure 1:
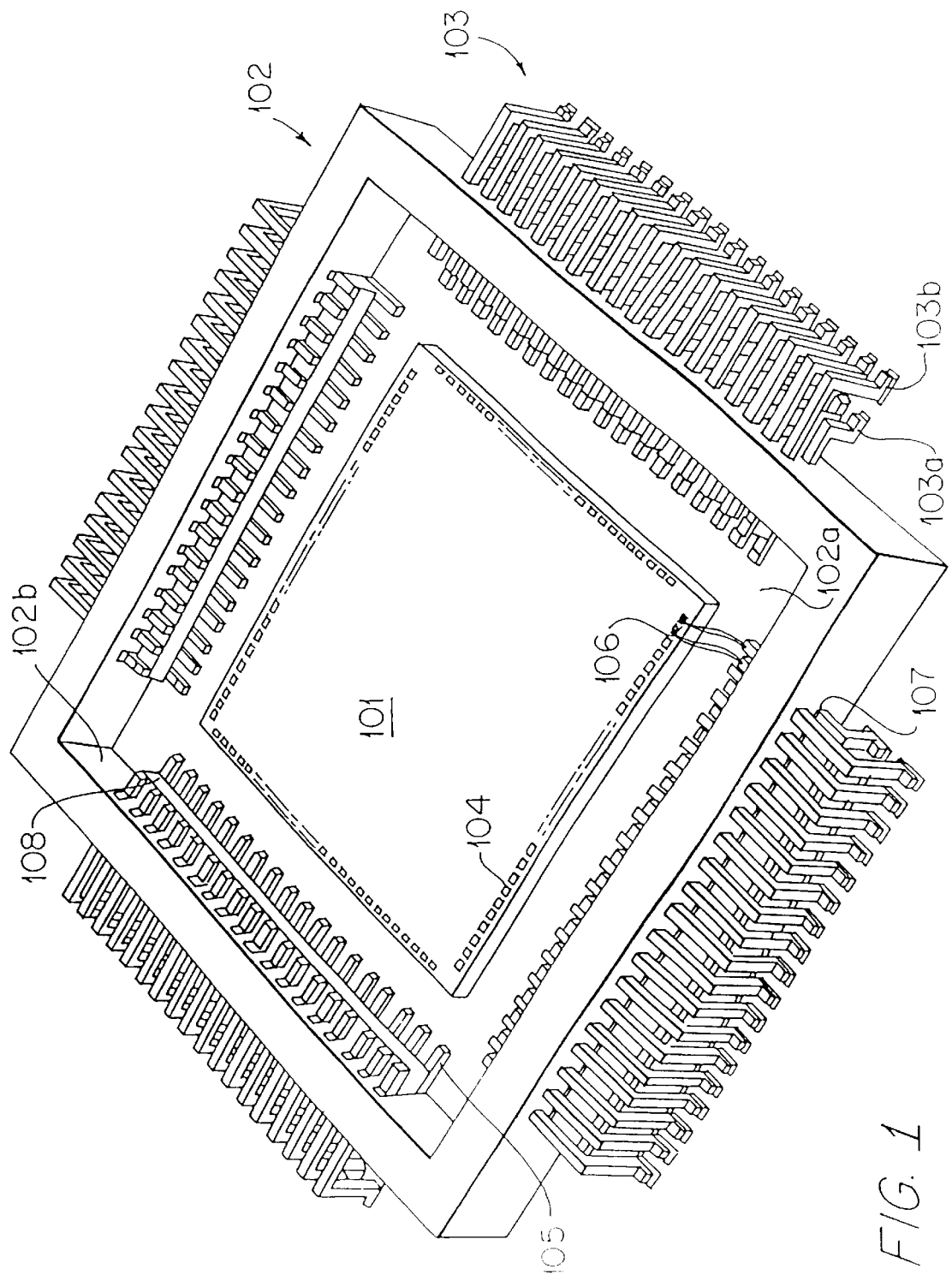
FIG. 1 is a perspective view of a two-tier embodiment of a prefabricated ,semiconductor die carrier in accordance with the present invention.

A prefabricated semiconductor die carrier in accordance with the present invention has multiple rows of electrically conductive leads arranged at vertically spaced multiple levels around the periphery of the carrier, an internal voltage and/or ground plane, and/or at least one high frequency capacitor. Each of the leads is manufactured and assembled into the semiconductor die carrier prior to the die attach step as an individually manufactured lead, rather than as a sub-element of a lead frame, to facilitate the multiple-row, multiple-level structure.

The leads of the semiconductor die carrier extend into the die carrier through the side walls of the die carrier, forming a series of vertically spaced rows of multiple leads around the semiconductor die. The portions of the leads extending through the side walls have wire bond terminals formed thereon. A wire bond insulator may be used to separate the rows of leads. The semiconductor die can be mounted within the carrier with the peripheral pads of the die facing up and away from the PCB, in a cavity-up configuration, or with the peripheral pads of the die facing down toward the PCB, in a flip-chip or cavity-down configuration.

Encapsulation for the semiconductor die carrier of the present invention is performed by filling the die cavity with an epoxy, a liquid crystal polymer such as HYSOL (a trademark of Dexter) or similar or other high-temperature material. Alternatively, the semiconductor die carrier may be capped with a plastic component or thermally conductive cap that serves as a heat sink.

The semiconductor die carrier of the present invention provides a package having a reduced size as compared to known semiconductor packages, yet increases the number of interconnects available for the designer and user. The die carrier may be configured to be pluggable, compatible with the PTH technology, or compatible with the SMT methodology. The semiconductor die carrier is prefabricated and tested prior to introduction of the semiconductor die to the carrier, thereby increasing finished product yields and reducing total unit cost. The configuration of the die carrier allows the semiconductor die to be bonded from multiple rows of pads on the die to multiple levels of vertically spaced rows of leads while maintaining a very low profile for the die carrier.

Details relating to the present invention will now be discussed with reference to the accompanying drawings. For the sake of convenience, the same reference numerals will be used to designate the same or similar components of the present invention throughout the accompanying drawings.

A perspective view of an embodiment of a prefabricated semiconductor die carrier in accordance with the present invention is shown in FIG. 1. In accordance with the embodiment of FIG. 1, the semiconductor die carrier includes a semiconductor die 101; an insulating substrate 102, having a floor 102a and a plurality of side walls 102b; a plurality of leads 103, including lower leads 103a and upper leads 103b; a plurality of bonding pads 104 formed on the semiconductor die; a plurality of bonding terminals 105 formed on the leads 103, respectively; and a plurality of bonding wires 106 each connecting at least one of the bonding pads 104 of the die to a corresponding one of the bonding terminals 105 formed on the leads.

The insulating substrate 102 of the semiconductor die carrier is made of a liquid crystal polymer or material having properties the same or similar to a liquid crystal polymer. Preferably, the liquid crystal polymer for the insulating substrate 102 is VECTRA (trademark), which has a coefficient of thermal expansion that is approximately the same as or similar to the coefficient of thermal expansion for silicon.

The insulating substrate 102 may be formed in a molding process carried out prior to inserting the leads 103 into the side walls 102b of substrate, and prior to mounting the die 101 onto the floor 102a of the substrate. During the molding process, a series of lead holes or passages 107 are molded within the side walls 102b of the substrate, each of the passages for receiving a corresponding one of the leads 103, and a series of ledges 108 are formed inside the side walls of the substrate around the periphery where the die is to be placed. The ledges 108 serve to support the leads 103 (during the wire bonding procedure, for example). As an alternative to forming the lead passage 107 and ledges 108 during the molding process, the lead passages and/or ledges could be added after molding by, for example, removing material of the substrate to form the lead passages and/or by applying insulative material (using an adhesive or epoxy, for example) to form the ledges.

In the embodiment of FIG. 1, the lower leads 103a and upper leads 103b are aligned in a straight line with respect to one another rather than staggered. In other words, for each upper lead 103b, a corresponding lower lead 103a is positioned directly beneath that upper lead. While not shown in FIG. 1, the lower leads 103a and upper leads 103b could be staggered with respect to one another. In a staggered configuration, none of the lower leads 103a would be beneath any of the upper leads 103b. Instead, progressing along a given one of the side walls 102b, every other lead would be a lower lead 103a or an upper lead 103b.

Figure 2:
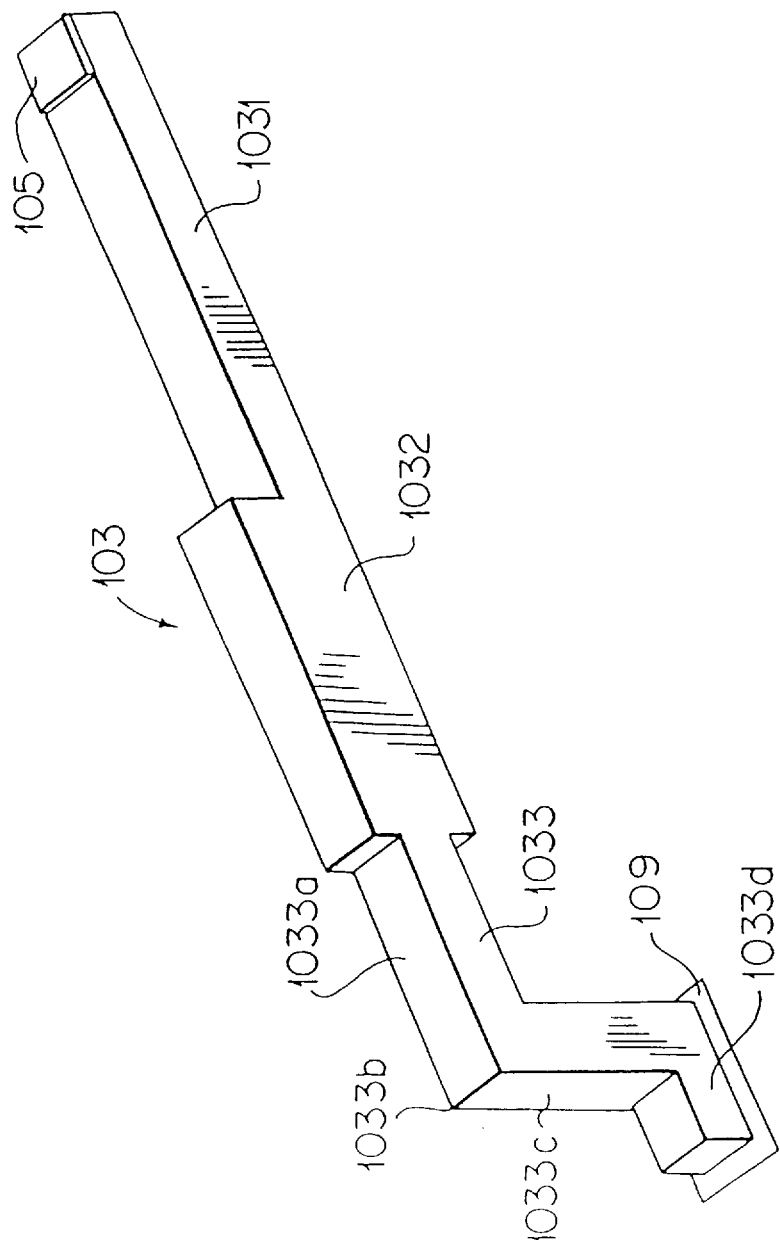
FIG. 2 is a perspective view of an SMT lead with an L-shaped foot portion configured in accordance with the present invention and positioned on a bonding pad of a multi-layer conductor such as a PCB.

A perspective view of an example of one of the leads 103 is shown in FIG. 2. As seen from FIG. 2, each of the leads 103 includes a bonding extension section 1031 having a bonding terminal 105 formed on an end portion thereof; a stabilizing section 1032; and an external lead section 1033. Each lead 103 may be formed of beryllium copper, phosphor bronze, brass, a copper alloy, tin, gold, palladium, or any other suitable metal or conductive material, and the bonding terminal 105 may be a gold-plated pad or pad formed of another suitable conductive material.

The bonding extension section 1031 is a relatively long and narrow portion of the lead 103 which protrudes toward the interior of the semiconductor die carrier from the inner surface of a corresponding one of the side walls 102b. The bonding terminal 105 may be, for example, a bonding pad to which a bonding wire 106 for attachment to a corresponding bonding pad 104 on the die 101 can be connected.

The stabilizing section 1032 of each lead 103 is the portion of the lead that is anchored within a side wall 102b of the substrate 102. The stabilizing section has a larger cross-sectional area than that of the bonding extension section 1031 and may also have a larger cross-sectional area than that of the external lead section 1033. The thick stabilizing section retains the lead and prevents forces exerted on the external lead section from transferring to the bonds associated with bonding wire 106.

The external lead section 1033 includes a horizontally-extending section 1033a, a corner section 1033b, a vertically-extending section 1033c, and a foot section 1033d. The configuration and length of the horizontally-extending and vertically-extending sections for each individual lead 103 are selected based on design requirements and, in particular, based on whether that lead will be used as a lower lead 103a or an upper lead 103b.

Dimensions of the semiconductor die carrier having two vertically spaced rows of multiple leads can be understood, for example, with reference to the accompanying figures.

As can be seen from FIG. 1, for example, a two-row semiconductor die carrier in accordance with the present invention may have, for example, a height of 2.0 mm, a width of 17.9 mm, and a lead row length of 8.7 mm. In this configuration, the semiconductor die carrier of the present invention can be manufactured to be approximately 64% smaller than conventional 128 pin QFPs, and at the same time provides 16 extra leads.

From FIG. 2, it can be understood that a lead 103 in accordance with the present invention may have a bonding extension section 1031 that is 1.5 mm in length; a stabilizing section 1032 that is 1.0 mm in length, and an external lead section 1033 having a vertically-extending section 1033c that varies in length depending whether the lead is an upper lead or a lower lead. As shown in FIG. 2, the foot section 1033d of a lead 103 configured for mounting in accordance with SMT can have a cross-section of 0.2×0.4 mm, for example, for mounting on an SMT solder joint 109 of a PCB having an exemplary cross-section of 0.4×0.6 mm.

Figure 3:
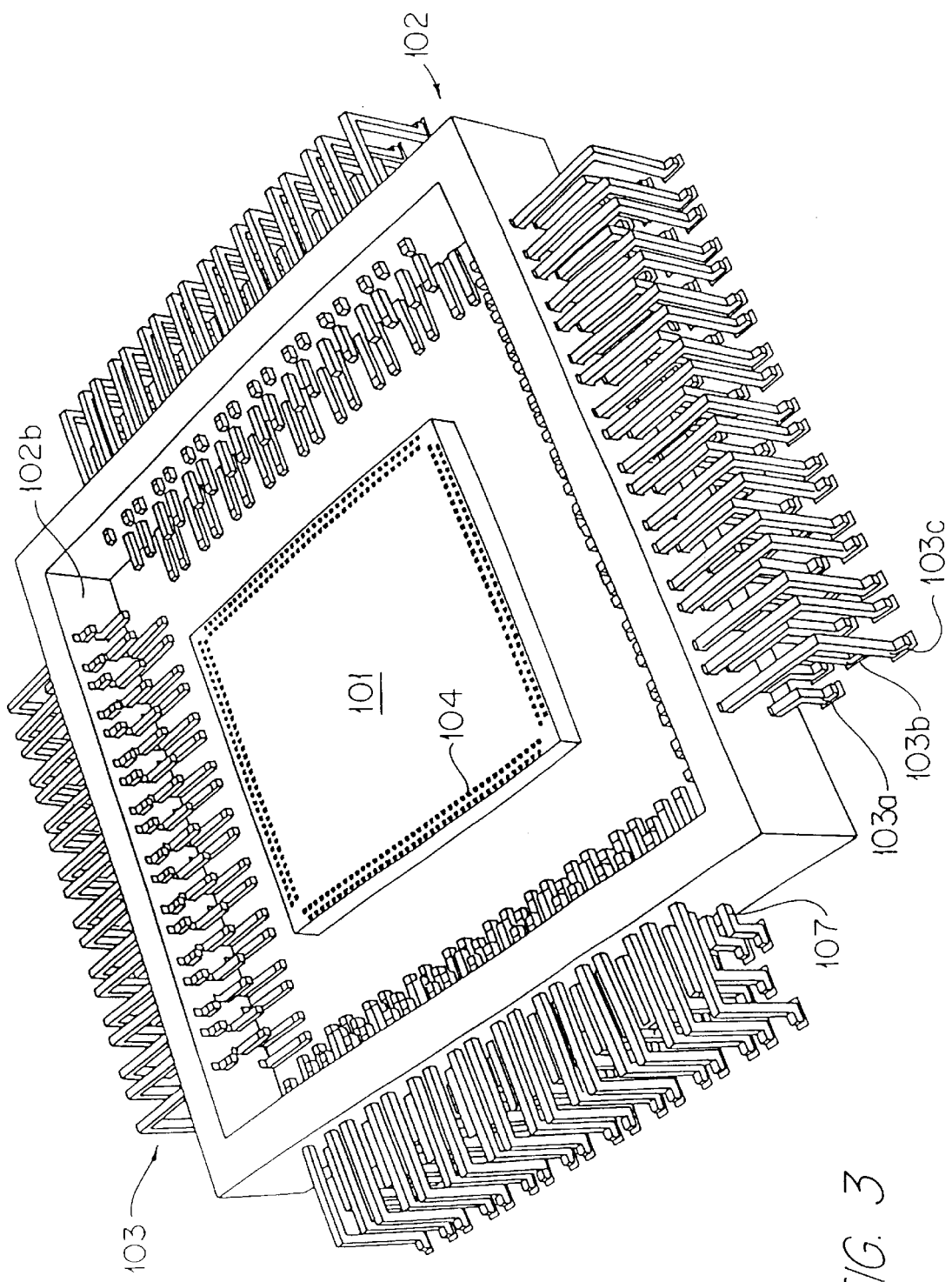
FIG. 3 is a perspective view of a three-tier embodiment of a prefabricated semiconductor die carrier in accordance with the present invention.

A perspective view of another embodiment of a prefabricated semiconductor die carrier in accordance with the present invention is shown in FIG. 3. The embodiment of FIG. 3 essentially corresponds to the embodiment shown in FIG. 1, except that three vertically spaced rows of multiple leads 103a, 103b, and 103c are used instead of two of such rows. Such a configuration enhances the interconnect capabilities of the semiconductor die carrier. While not shown in FIG. 3, ledges 108 might be applicable to the three-row semiconductor die carrier in accordance with the present invention.

The semiconductor die carrier of FIG. 3 may be manufactured in the same manner that the carrier shown in FIG. 1 is manufactured. Exemplary dimensions for the embodiment of FIG. 3 are a height of 2.7 mm; a width of 21.5 mm; and a lead row length of 11.8 mm. In this configuration, the semiconductor die carrier of FIG. 3 can be configured to provide 208 leads using approximately half of the area (for example, board area) of that required by conventional QFP technology.

Figure 4:
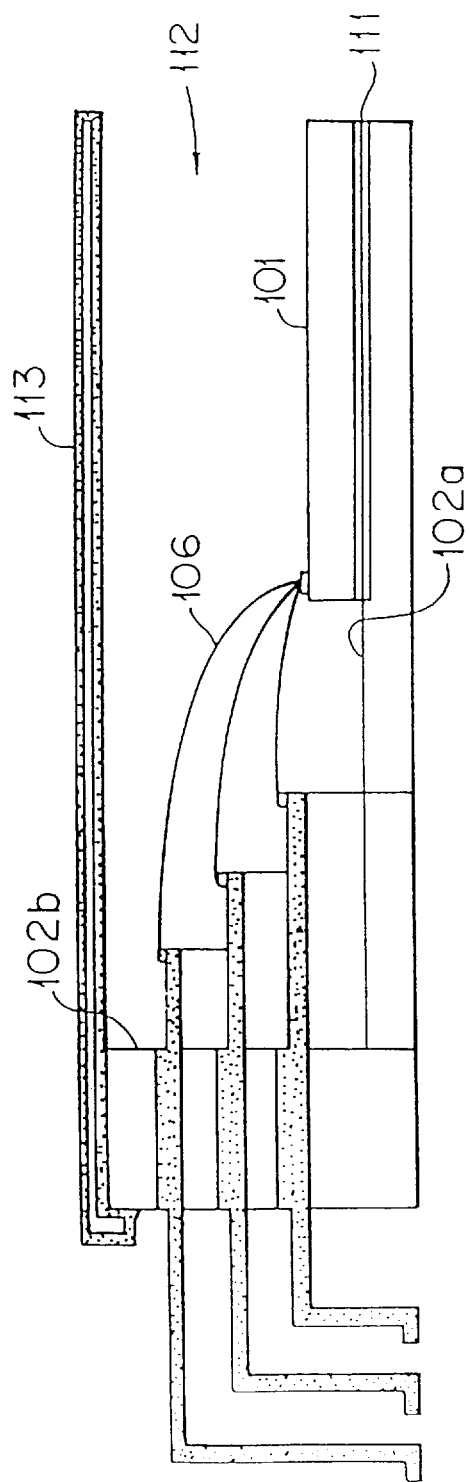
FIG. 4 is a partial side view of a semiconductor die carrier including a cap, cavity-up configuration.

A partial side view of the embodiment of FIG. 3 is shown in FIG. 4. The illustration of FIG. 4 shows features of the semiconductor die carrier including a die bond adhesive 111 for mounting the die 101 on the floor 102a; bonding wires 106 which, in each of the embodiments of the present invention, may be dimensioned to have a wire length of less than 1.0 to 2.5 mm, for example; a cavity filler 112 used to fill the cavity defined by the floor 102a and side walls 102b of the carrier during the encapsulation process; and a sealing cap 113, made of plastic or other thermally-conductive material such as metal or VECTRA (trademark), and capable of functioning as a heat sink, for providing a cover for the semiconductor die carrier.

Figure 5:
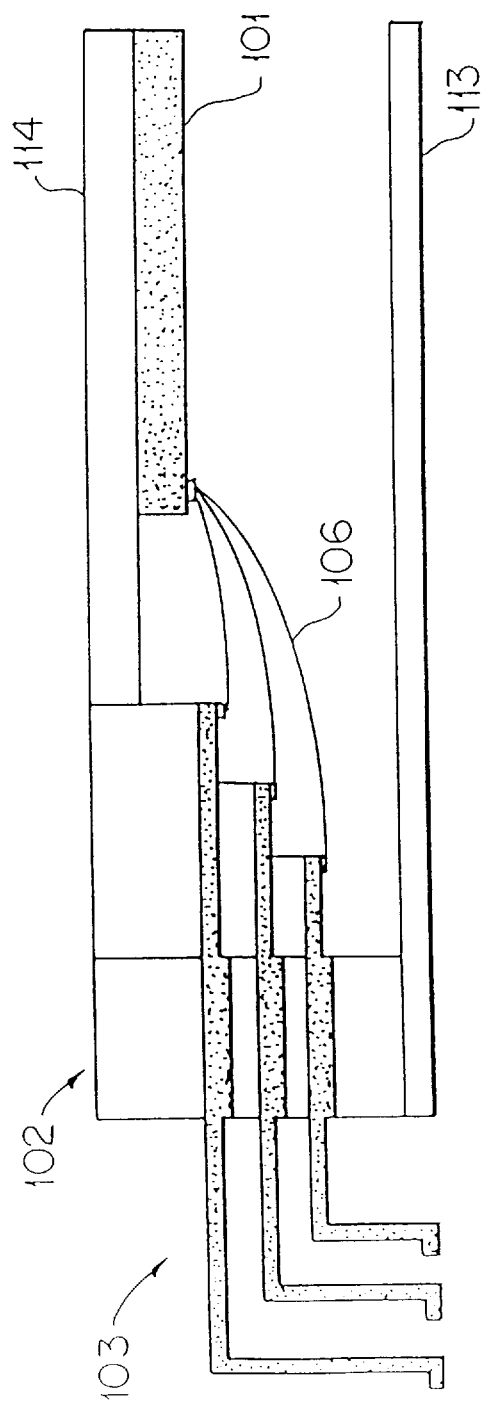
FIG. 5 is a partial side view of a semiconductor die carrier having a cavity-down configuration.

FIGS. 5–8 show various configurations relating to the placement of the semiconductor die 101 within the semiconductor die carrier. Although FIGS. 5–8 depict an embodiment having three-row configuration, it should be noted that the die placement configurations illustrated in these figures are also applicable to the other embodiments of the present invention, including the one-row and two-row embodiments discussed above and the four-row embodiments discussed below.

Where FIG. 4 corresponds to a cavity-up configuration, in which the semiconductor die is mounted within the carrier with the peripheral pads of the die facing up and away from the PCB or other mounting surface, FIG. 5 corresponds to a cavity-down or flip-chip configuration, in which the peripheral pads of the die face down toward the PCB or other interface surface. In the configuration of FIG. 5, the die 101 is mounted on a heat sink cap 114, preferably formed of a thermally conductive material, and then wire bonding, encapsulation, and sealing using a sealing cap 113, preferably formed of VECTRA (trademark), take place. The heat sink cap 114 can be an integrally molded component of the substrate 102, or attached to the substrate 102 after molding of the substrate is completed.

Figure 6:
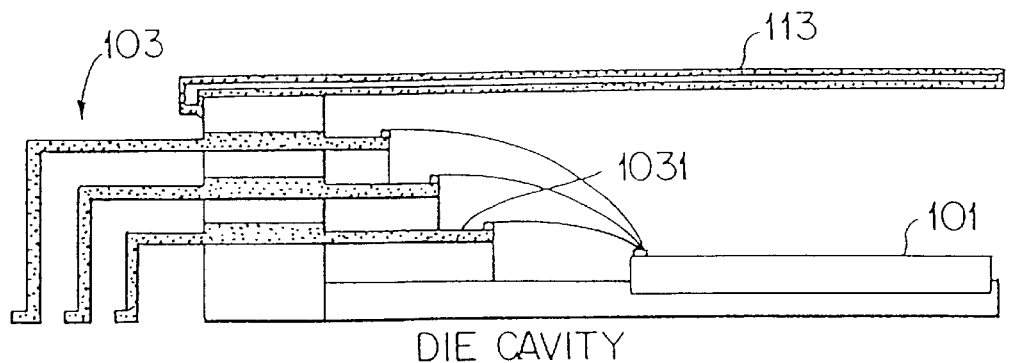
FIG. 6 is a partial side view of a semiconductor die carrier having a die indentation configuration and including a cap.

FIG. 6 shows that the semiconductor die 101 may be embedded or placed into an indentation, similar to the size of the semiconductor die, formed in the floor 102a for receipt of the die. In this configuration, the top surface of the die is located below the bonding extension sections 1031 of the lower leads 103a.

Figure 7:
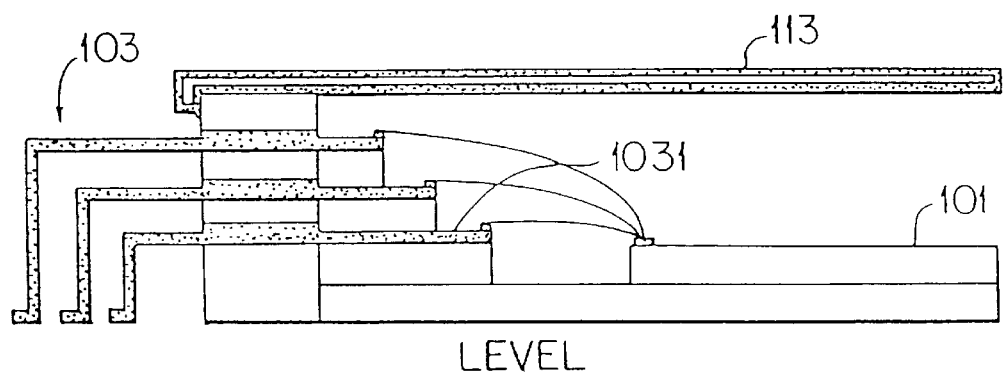
FIG. 7 is a partial side view of a semiconductor die carrier having a same or similar level configuration and including a cap.

FIG. 7 shows the placement of the semiconductor die 101 on top of a flat floor 102a. In this configuration, the top surface of the semiconductor die 101 is the same level or similar in height to the height of the bonding extension sections 1031 of the lower leads 103a.

Figure 8:
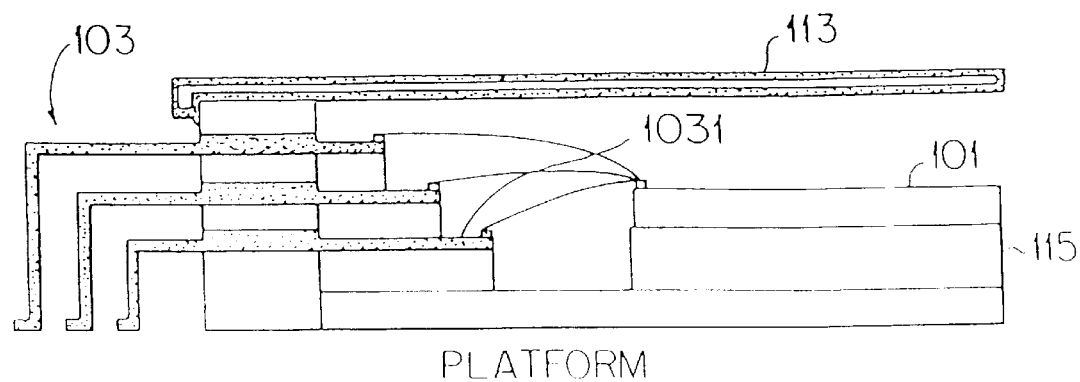
FIG. 8 is a partial side view of a semiconductor die carrier having a platform configuration and including a cap.

FIG. 8 shows the placement of the semiconductor die 101 on a raised platform 115, similar to the size of the die, formed in the interior of the semiconductor die carrier. The raised platform 115 may be an integrally molded component of the substrate 102, or attached to the substrate 102 after molding of the substrate is completed.

It should be noted that, in each of the configurations shown in FIGS. 5–8, the semiconductor die 101 may be mounted using an adhesive material, epoxy, or the like.

Figure 9:
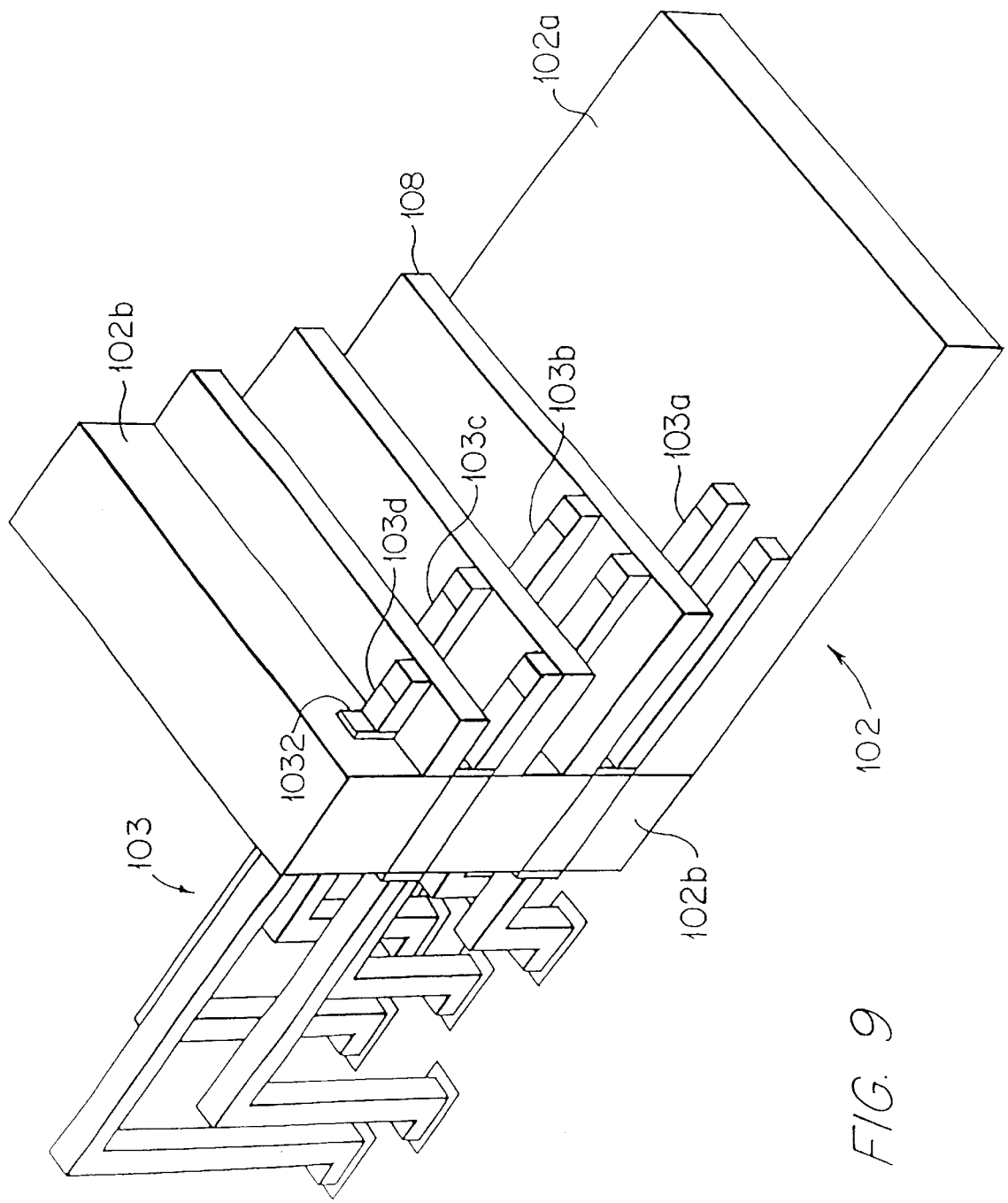
FIG. 9 is a partial perspective view of a four-tier embodiment of a prefabricated semiconductor die carrier in accordance with the present invention.

A partial view of another embodiment of a preferred semiconductor die carrier in accordance with the present invention is shown in FIG. 9. The embodiment of FIG. 9 essentially corresponds to the embodiments shown in FIGS. 1 and 3, for example, except that four vertically spaced rows of multiple leads 103a, 103b, 103c, and 103d are used instead of two or three of such rows. Such a configuration further enhances the interconnect capabilities of the semiconductor die carrier. FIG. 9 illustrates that, in all the embodiments of the present invention, the stabilizing section 1032 of each lead 103 may overlap or extend beyond the inner surface of its corresponding side wall 102b, if desired. Alternatively, in all of the embodiments of the present invention, a stop could be used to prevent over-insertion of the leads.

The semiconductor die carrier of FIG. 9 is manufactured in the same manner that the die carriers shown in FIGS. 1 and 3 are manufactured. Exemplary dimensions for the embodiment of FIG. 9 are a height of 3.4 mm; a width of approximately 28.0 mm; and a lead row length of 16.2 mm. In this configuration, the semiconductor die carrier of FIG. 9 can be manufactured to be approximately 57% smaller than conventional 304-pin QFPs.

Figure 10:
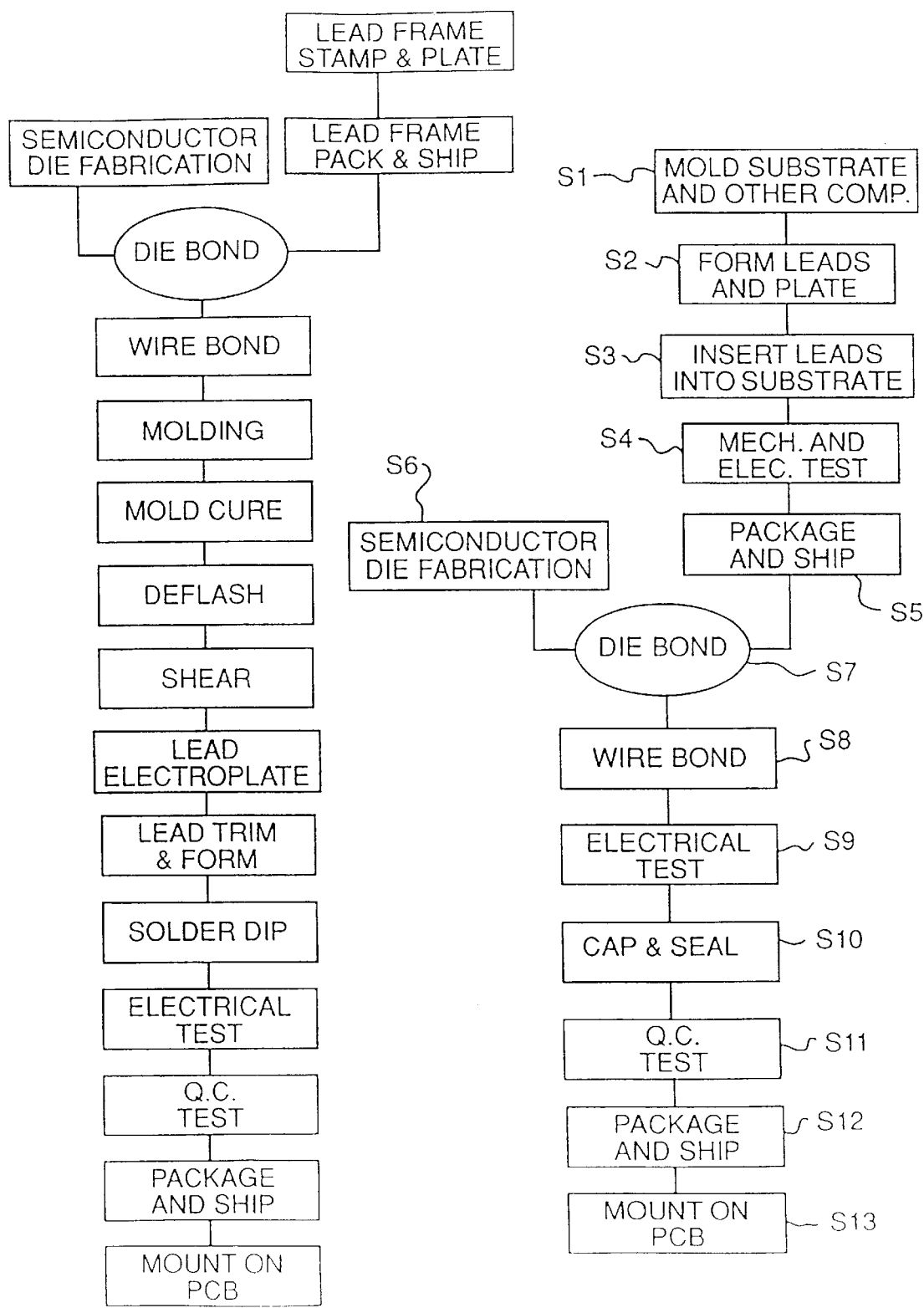
FIG. 10 is a perspective view of a multi-die configuration of a prefabricated semiconductor die carrier in accordance with the present invention.

FIG. 10 is a perspective view of another aspect of the present invention that is applicable to all of the previously-discussed embodiments. As can be seen from FIG. 10, a plurality (e.g., four) of semiconductor dies 101 may be incorporated within a prefabricated semiconductor die carrier in accordance with the present invention, thus allowing an even more efficient usage of materials and board space. In FIG. 10, a multi-layer ceramic component 122, having a plurality of levels of electrically conductive material therein, is glued or otherwise adhered to the floor 102a, and the plurality of semiconductor dies 101 are glued or otherwise adhered to the multi-layer ceramic component. The dies may or may not be electrically connected to the multi-layer ceramic component using C4, wire bond, TAB, or other bonding technologies. In the case where C4, TAB, or like bonding is used, conductive lands on the bottom surface of the dies are used to provide electrical interconnection between the dies and the ceramic component 122. In the case where wire bonding is used, bonding wires (now shown) connected at one end to the bonding pads 104 and at the other end to the ceramic component 122 are used to provide electrical interconnection between the dies and the ceramic component.

The leads 103 are either soldered to the ceramic component 122, or electrically connected to the ceramic component using bonding wires (not shown). For the bonding pads 104 along the outwardly-facing edges of each semiconductor die 101, rather than transmitting the signals between the leads 103 and the bonding pads 104 via the multi-layer ceramic component 122, such signals may be transmitted directly between the bonding pads and leads via bonding wires (not shown) directly connected to the leads 103 at one end and directly connected to the bonding pads 104 at the other end.

While FIG. 10 shows the incorporation of four semiconductor dies within a single prefabricated semiconductor die carrier in accordance with the present invention, either more or less dies per semiconductor die carrier are contemplated. As stated previously, the incorporation of a plurality of semiconductor dies within a single die carrier allows more effective usage of materials and board space.

The multi-layer ceramic component 122 may be configured to include one or more power planes and/or one or more ground planes. In this regard, each power plane of the multi-layer ceramic component 122 could be connected to a bonding wire coupled to at least one of the leads 103 connected to an external power source (e.g., +5 V or −5 V), and each ground plane of the ceramic component could be connected to a bonding wire coupled to at least one of the leads connected to an external ground (0 V). Preferably, each die 101 secured to the multi-layer ceramic component 122 would have its periphery surrounded by at least one power plane and/or at least one ground plane. Positioning the power and ground supplies of the PCB level within the insulative module of the semiconductor die carrier results in many advantages, including the reduction of signal degradation and the facilitation of design and manufacturing.

Figure 11A:
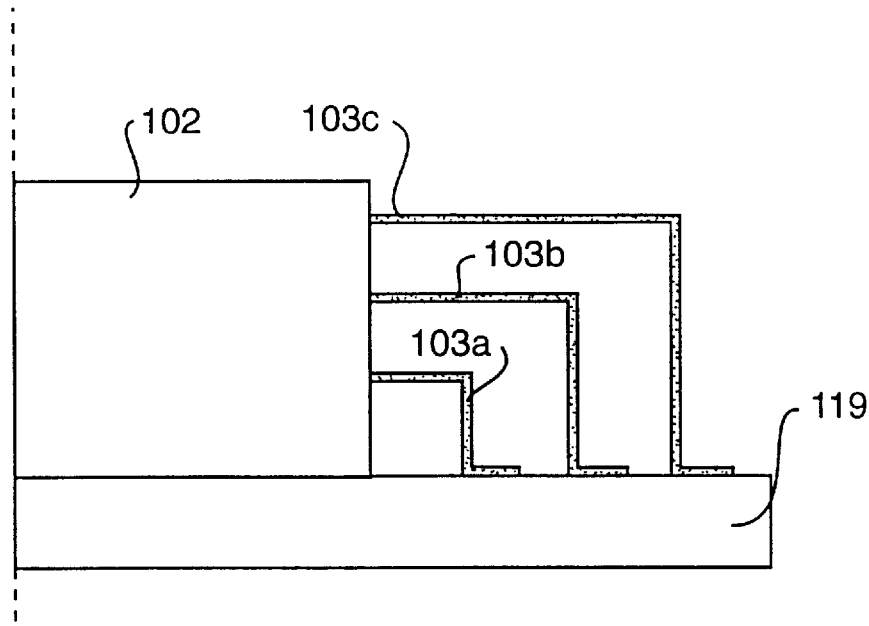
FIG. 11 is a partial side view of a semiconductor die carrier incorporating a voltage plane around the periphery of the semiconductor die.
Figure 11B:
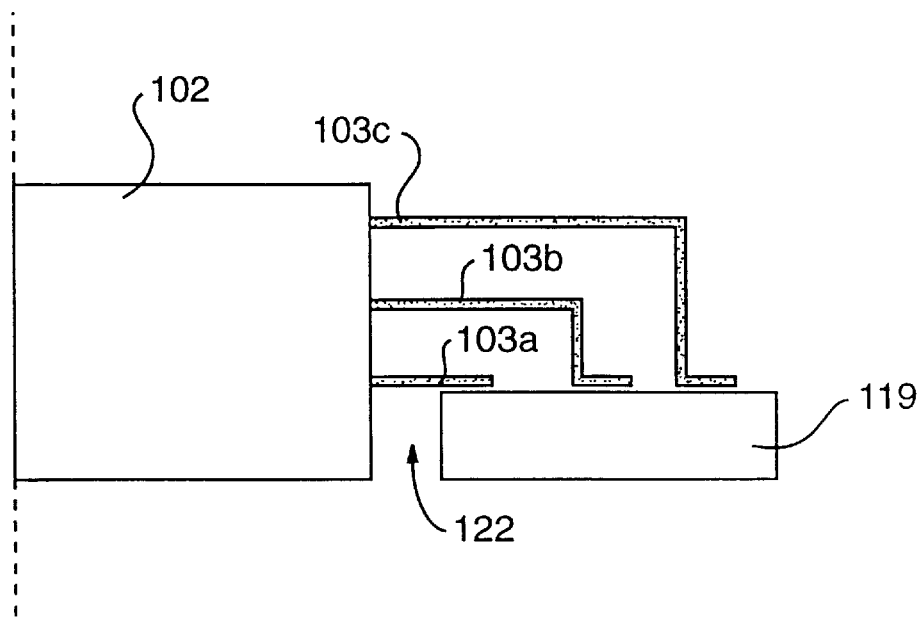

FIG. 11 is a partial side view of a semiconductor die carrier in accordance with the invention including a stick-on adhesive copper foil 116 acting as a V+ bus (or alternatively, a V− bus) all around the periphery of semiconductor die 101. As with the embodiment of FIG. 10, this pulls the power supply at the PCB level inside the semiconductor die carrier module. In an alternative embodiment, power plane 116 could be replaced with a copper foil acting as a ground plane or, alternatively, a separate ground plane surrounding the periphery of semiconductor die 101 could be used in addition to power plane 116 with the ground plane either being surrounded by or surrounding power plane 116. Although not shown in FIG. 11, die attach plate 114 and power plane 116 are preferably attached to opposite ends of a high frequency capacitor in accordance with the discussion pertaining to FIGS. 12 and 13 below.

Figure 12:
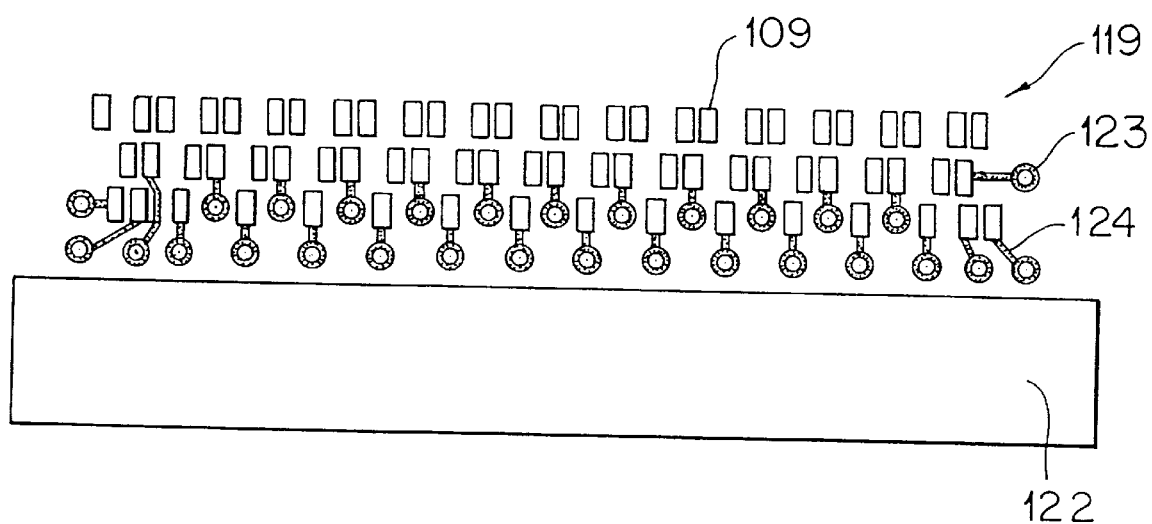
FIGS. 12 and 13 are partial top and side views, respectively, of a semiconductor die carrier including an internal capacitor.
Figure 13A:
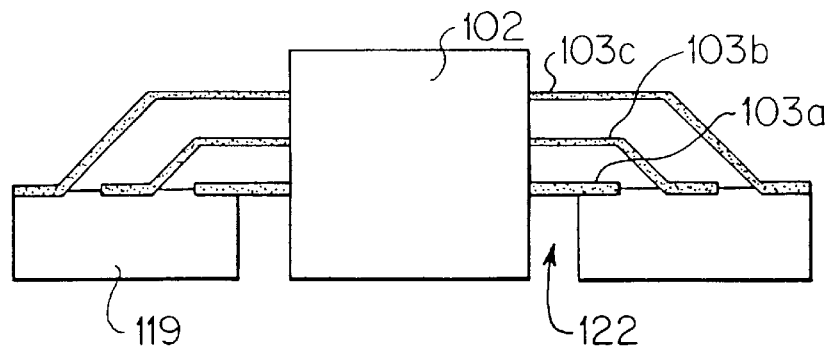
Figure 13B:
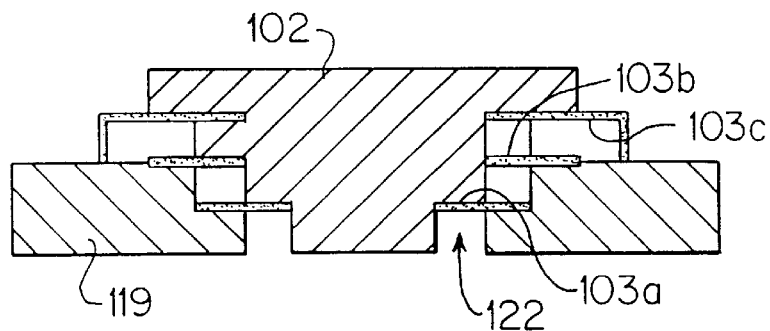

FIG. 12 is a partial top view of a semiconductor die carrier including an internal capacitor 117 mounted at one or more (e.g., all) of the corners of the semiconductor die carrier, and FIG. 13 is a side view of the subject matter surrounded by the circle depicted in FIG. 12. Capacitor 117 is a high frequency capacitor (0.1 to 100 $\mu$F, for example) designed to reduce performance-limiting noise problems such as delta I degradation which arise especially in connection with semiconductor die carriers that handle high frequency (50–110 ns) signals. Such a situation would occur if semiconductor die 101 were a microprocessor having an operating frequency of 300 Mhz, for example.

Although capacitor 117 as depicted in FIGS. 12 and 13 is represented as an internal capacitor housed within the semiconductor die carrier, alternatively, capacitor 117 could be an external capacitor secured externally with respect to the semiconductor die carrier. As an example, one of the capacitors 117 could be located on an external surface of the semiconductor die carrier at each of its four corners.

FIG. 13 depicts a preferred embodiment of the present invention (leads and die-to-lead bonding wires not shown) wherein power plane 116 (at +V or −V, for example) on grounded die attach plate 114 surrounds the periphery of semiconductor die 101 with one end of capacitor 117 connected to the grounded die attach plate and with the other end of capacitor 117 connected to the power plane. Such connections are achieved, respectively, using a first bonding wire 118a and a second bonding wire 118b. Although not all are shown in FIG. 12, each of the connections depicted in and relating to FIG. 13 is also applicable to the embodiment depicted in FIG. 12.

Figure 14A:
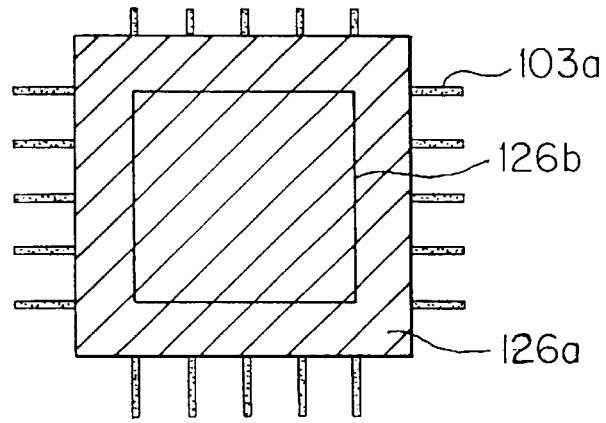
FIG. 14 is a partial perspective view of a semiconductor die carrier comprising an external capacitor located at ends of the rows of leads on one or more sides of the die carrier.
Figure 14B:
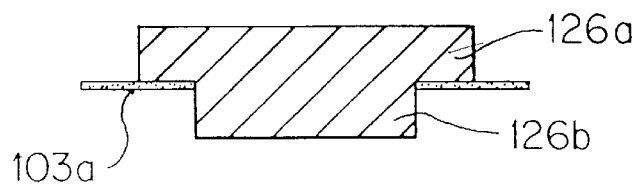

FIG. 14 shows an alternative embodiment of the invention wherein a high frequency capacitor (comprising a block of ceramic, for example) is mounted at each end (or, alternatively, at just one end) of each of the rows of leads 103 on the external surface of the semiconductor die carrier. More particularly, as depicted in FIG. 14, a capacitor 119 is secured to the outermost surface of each of the outermost leads of rows 103a and 103c on each of the sides of the die carrier (or, alternatively, on just one, two, or three sides of the die carrier), providing a total of up to eight such capacitors (i.e., up to two capacitors per side). Preferably, each capacitor 119 is soldered, epoxied, or otherwise adhered to insulative side wall 102b and/or the outermost leads in each of rows 103a and 103c, as depicted in FIG. 14. The purpose of capacitor 119 of FIG. 14 is the same as that of capacitor 117 of FIGS. 12 and 13, namely, to reduce noise and delta I degradation and to facilitate the transmission of high frequency signals to and from semiconductor die 101 via the leads 103.

As with capacitor 117 of FIGS. 12 and 13, capacitor 119 of FIG. 14 may be secured to the leads of the semiconductor die carrier using epoxy, adhesive, solder, or the like. Moreover, the present invention contemplates replacing one or more (e.g., all) of capacitors 119 with some other externally mounted device such as a temperature sensor or crystal.

The external placement of capacitors 119 of FIG. 14 provides a number of important advantages. First and foremost, the placement of capacitors on external rather than internal surfaces of the semiconductor die carrier prevents disruption of valuable interior die carrier space, thereby providing substantially more room within the die carrier for the inclusion of additional components. Moreover, external capacitors are not constrained by the dimensions of the internal cavity of the die carrier and, therefore larger capacitors can be used when die carrier design needs so dictate. Furthermore, the external placement of capacitors 119 makes them very accessible and, therefore, more suitable for testing, replacement, and upgrades.

Figure 15A:
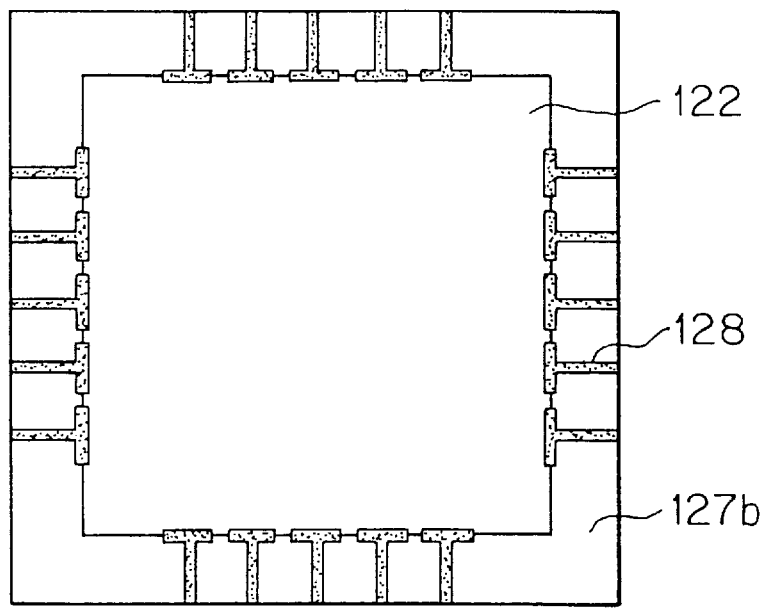
FIG. 15 is a partial perspective view of a semiconductor die carrier including an external capacitor comprising capacitive epoxy secured between adjacent ones of the leads on one or more sides of the die carrier.
Figure 15B:
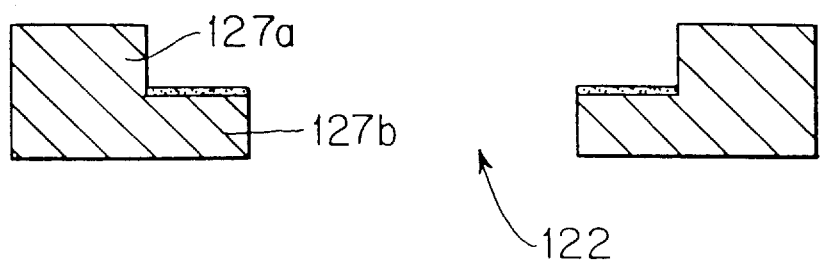

FIG. 15 is a partial perspective view of another alternative embodiment of the semiconductor die carrier of the present invention. In the embodiment of FIG. 15, as with the other embodiments of the invention, within each row of leads (e.g., the row of leads 103c) each lead is separated from one of its adjacent leads by a first distance (0.8 mm, for example) and from the other of its adjacent leads by a second distance (0.5 mm, for example), the first distance being greater than the second distance. As an alternative to and for the same purposes as previously described with respect to capacitors 117 and 119, a capacitor 120 may be placed between one or more (e.g., all) of the adjacent leads within one or more of the rows of leads which are separated by the lesser distance (as shown in FIG. 15) or, alternatively, between one or more (e.g., all) of the adjacent leads within one or more of the rows of leads which are separated by the greater distance (not shown). Preferably, each capacitor 120 comprises a dielectric or capacitive epoxy including an epoxic carrier having a viscous quality and related curing properties, or a ceramic material, sandwiched by the leads on either side. It is envisioned that capacitor 120 may not only enhance the electrical properties of the semiconductor die carrier, but also may enhance its mechanical properties by providing physical support to the leads with which it is in contact, thereby stiffening the leads to prevent inadvertent bending and the like. In the embodiment of FIG. 15, it is envisioned that all of the rows or, alternatively, only some of the rows (e.g., rows 103a and 103c) will be provided with capacitors 120.

Figure 16A:
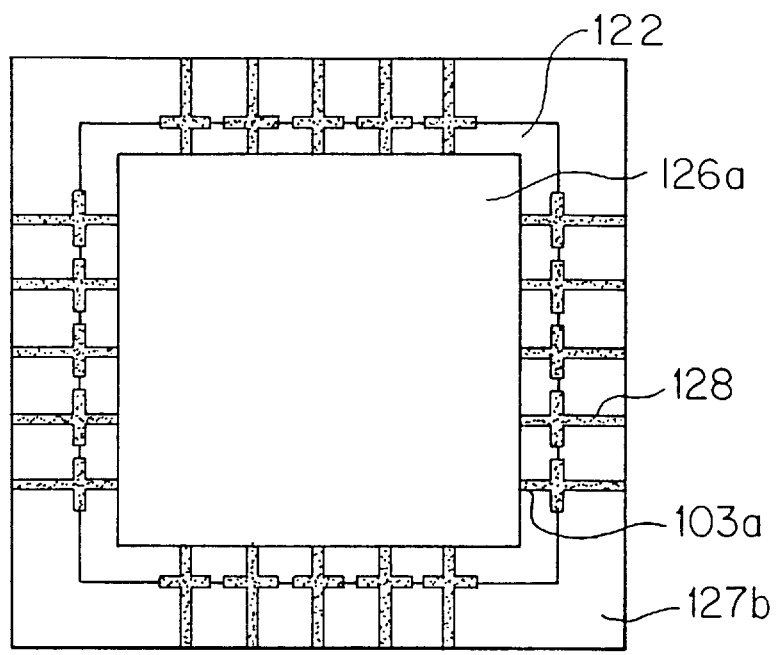
FIG. 16 is a partial top view of a footprint for a plurality of rows of leads showing multiple ground leads surrounding a high frequency signal lead.
Figure 16B:
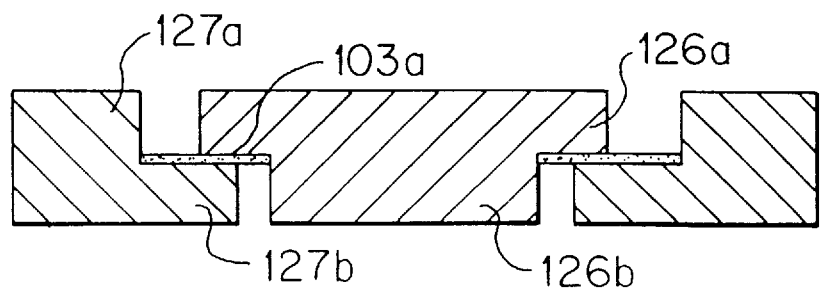

Previously described capacitors 117, 119, and 120 all serve to reduce noise and delta I degradation and enhance the ability of the semiconductor die carrier to handle high frequency signals. In doing so, such capacitors maintain the edge rate and edge integrity of the high frequency signals which travel to and from the semiconductor die. Such properties can be further enhanced by arranging ground leads around each high frequency signal lead of the semiconductor die carrier. As an example of such an arrangement is depicted in FIG. 16, which is a partial top view of the semiconductor die carrier of the present invention showing the footprint leads 103a, 103b, and 103c would leave on a PCB following securement of the semiconductor die carrier to the PCB. In the embodiment of FIG. 15, each high frequency signal lead S is surrounded by a plurality of ground leads G, which enhances the integrity of any high frequency signal travelling on high frequency signal lead S due to the coaxial cable-type effect resulting from the surrounding of the high frequency lead S with ground leads G.

The previously-discussed embodiments and configurations in accordance with the present invention contemplate a prefabricated semiconductor die carrier having one row of multiple leads or two, three, or four vertically spaced rows of multiple leads. While not shown in the accompanying drawings, in accordance with the present invention, prefabricated semiconductor die carriers having five or more vertically spaced rows of multiple leads are also contemplated. Such prefabricated semiconductor die carriers are considered to be within the spirit and scope of the present invention. Moreover, although the power/ground plane and high frequency capacitor embodiments have been depicted herein in connection with die carriers incorporating three rows of leads, it should be noted that such embodiments are also applicable to semiconductor die carriers having one row of multiple leads or two, four, or five or more vertically spaced rows of multiple leads.

Figure 17A:
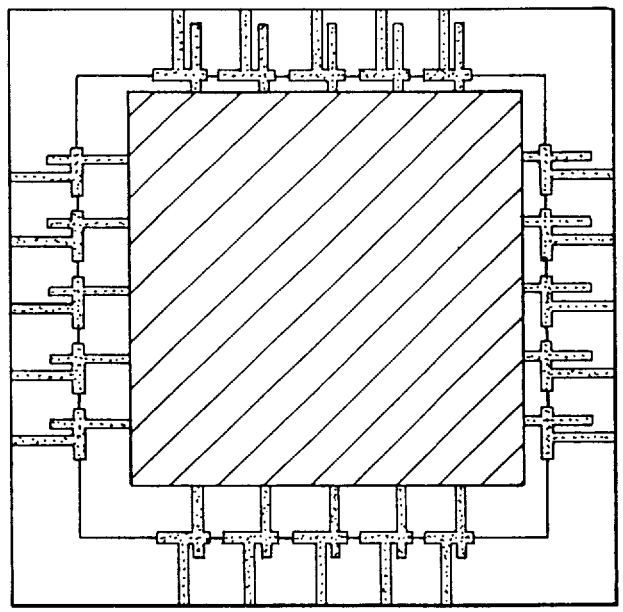
FIG. 17 depicts a pair of flowcharts comparing a conventional manufacturing method with a method in accordance with the present invention performed in order to manufacture, transport, and mount a prefabricated semiconductor die carrier.
Figure 17B:
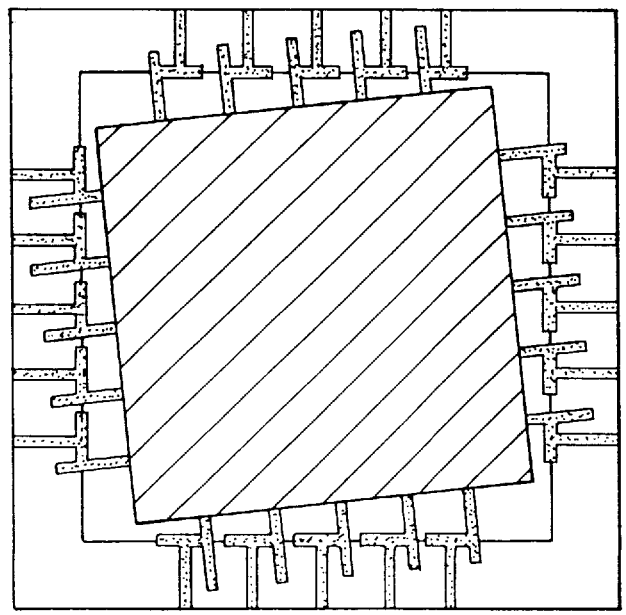

FIG. 17 includes two flowcharts. The flowchart at the left illustrates steps performed in the manufacturing of a conventional molded plastic semiconductor package. The flowchart at the right illustrates steps performed in a manufacturing process for producing a prefabricated semiconductor carrier in accordance with the present invention. As can be seen from FIG. 17, the present invention entails fewer steps following the die bond procedure as compared to conventional manufacturing processes. Most notably, the molding, mold cure, deflash, shear, lead electroplate, lead trim and form, and solder dip steps of the conventional manufacturing process are completely absent from the manufacturing process of the present invention following die bonding. The result is that the costly yield losses associated with the conventional process are completely avoided by the manufacturing process of the present invention.

In accordance with the present invention as depicted in the rightward flowchart of FIG. 17, in a step S1, the substrate 102, including the floor 102a and side walls 102b and, if desired, lead passages 107 and ledges 108, are integrally formed using a molding process. As an alternative to forming the lead passages 107 and ledges 108 during the molding process, the lead passages and/or ledges could be added after molding by, for example, removing material of the substrate to form the passages and/or by applying insulative material (using an adhesive or epoxy, for example) to form the ledges. Moreover, it is envisioned that rather than being formed integrally in a single molding process, the floor 102a and side walls 102b could be molded separately, and then fastened together using an epoxy or other adhesive. The use of VECTRA (trademark) as the material for the substrate allows the parts of the semiconductor die carrier to be molded and assembled with a high degree of accuracy. As an alternative to forming the substrate 102 and then inserting the leads into the substrate, the substrate could be formed around the leads in an insert molding process.

In a step S2, the leads 103 are formed. The lead formation step S2 entails punching or stamping out individual leads from strips or drawn wire using, for example, a die. Applicants have found that by individually manufacturing each lead 103, rather than using a lead frame to manufacture such leads, manufacturing costs are reduced and, at the same time, yield is increased.

The aforementioned lead-manufacturing methods allow for selective plating and automated insertion. The leads for stamping can either be loose, on a bandolier carrier, or on a strip since the asymmetrical shape lends itself to consistent orientation in automated assembly equipment. The different length external lead sections assist with orientation and vibratory bowl feeding during automated assembly. The present invention is compatible with both stitching and gang-insertion assembly equipment. The insulative components have been designed to facilitate automatic and robotic insertion onto PCBs or in termination of wire to connector.

Step S3 of FIG. 17 involves inserting the leads 103 into the side walls 102b of the substrate 102. In the situation where the floor 102a and the side walls 102b are formed separately and then fastened together at a later time, the leads may be inserted into the side walls before they are fastened to one another or to the floor. Each of the leads 103 is inserted into a corresponding one of the lead passages 107 in the side walls 102b. The dimensions of the leads 103 and lead passages 107 are such that each lead fits tightly within it corresponding lead passage 107. However, if desired, each lead 103 can be further fastened within its corresponding lead passage 107 and/or onto a corresponding ledge 108 using an epoxy or other adhesive material.

It should be kept in mind that rather than forming the substrate and then inserting the leads into the side walls of the substrate, placement of the leads 103 with the side walls 102b of the substrate may be accomplished using an insert molding process. Insert molding is applicable to all embodiments of the present invention.

Either prior to or following step S4, elements such as power plane 116 and/or high frequency capacitors 117, 119, or 120 may be soldered or otherwise adhered to the semiconductor die package. If such elements are added before step S4, which is preferable, then they may undergo electrical and mechanical testing along with the remaining components of the semiconductor die carrier during the course of carrying out step S4. In other words, capacitor and inductance tests can be performed with respect to such elements before the initial shipping and die placement.

In step S4, mechanical testing is performed to ensure that the leads 103 are securely fastened within the substrate 102; to ensure that coplanarity of the leads 103 falls within an acceptable range; to ensure that each lead is aligned properly within its respective lead passage; and the like. Also, electrical testing is performed to ensure that signals can be transmitted properly through the leads of the carrier to the exterior of the carrier, and vice versa; and to ensure that none of the leads are shorted or would be likely to short during subsequent stages of the manufacture and usage of the semiconductor die carrier. In accordance with step S5, the substrate 102 having leads 103 disposed therein is packaged and then shipped to the place where a semiconductor die, manufactured in step SG, will be bonded to the substrate.

Step S7 of FIG. 17 involves attaching the semiconductor die 101 to floor 102a or another support surface (for example, a raised platform 115) within the semiconductor die carrier. The attachment may be carried out using an adhesive, an epoxy or the like.

Step S8 entails a bonding procedure wherein a bonding wire 106 is connected between components of a pair including a bonding pad 104 on the die 101 and a bonding terminal 105 on one of the leads 103. The bonding wires allow electrical connection between the die 101 and the various leads 103.

In step S9, further electrical tests may be performed to provide additional assurance that an acceptable product is being manufactured. In step S10, encapsulation is performed by filling the cavity defined by the floor 102a and the side walls 102b of the substrate 102 with epoxy, a liquid crystal polymer such as VECTRA (trademark), or other high-temperature material. Then the semiconductor die carrier may capped with a plastic component or thermally-conductive cap that may serve as a heat sink, and thereafter sealed, although use of a cap is optional. It should be noted that when a cap is used, the aforementioned encapsulation step becomes optional. The heat sink and/or high-temperature material which may be used for encapsulation and sealing facilitate the heat dissipation capabilities of the semiconductor die carrier. In step S11, further mechanical and electrical quality control testing may be performed to increase the likelihood that the semiconductor die carrier will function as expected.

In accordance with step S12, the completed semiconductor die carrier is packaged and shipped to the customer. Preferably, the semiconductor die carrier is packaged and shipped to the customer using the same transportation package it was received in.

Step S13 relates to the mounting of the finished semiconductor die carrier on or within an interface surface such as a PCB surface. In step S13, either PTH technology or SMT methodology may be used to accomplish PCB interfacing or, alternatively, the carrier may be plugged into a pluggable socket mounted on a PCB or other interface device.

The configurations of the footprints of the semiconductor die carrier (or of the pluggable socket, if one is used) facilitate the routing of traces on the PCB or other interface surface onto or within which the semiconductor die carrier is being mounted. Further mechanical and electrical testing can be performed after the mounting process is completed.

As compared to conventional methods, there are significantly fewer production steps involved in producing a semiconductor die carrier in accordance with the present invention. The semiconductor die carrier of the present invention begins as a pre-formed platform into which the die is inserted. Encapsulation is then accomplished by capping and sealing the platform after it has been tested. This results in the elimination of the entire molding, bending, and clean-up processes and the related bonding of the carrier. Because the leads of the present invention are pre-formed and inserted into the plastic platform, they are undisturbed by additional procedures conventionally performed after the die is introduced into the semiconductor package. In the conventional process, the most sensitive aspects of the manufacturing process, encapsulating the die and electroplating and forming the leads, are performed after the die and the semiconductor package have been mated. This results in comparatively costly scrap, which may be due to lack of coplanarity among the leads, breakage, wire bond failure due to high-pressure molding, or other problems. All of these problems result in sacrificing the die as well as the package. The semiconductor die carrier of the present invention, however, could be delivered to the die attach area completely tested for plating, mechanical integrity, and dimensional characteristics, and the die need only be inserted into packages meeting acceptable quality standards. The elimination of the intermediate processes also reduces labor costs.

The semiconductor die carrier of the present invention can be configured with a precise number of leads easier than current designs due to the programmable nature of its assembly. A designer can specify varied numbers of leads or changes in package size, without the need to design and manufacture new lead frame configurations. With the present invention, both the number of leads on a side of a package, and the number of rows of leads, can be varied simply by producing a new mold for the prefabricated platform and reprogramming the lead insertion equipment to vary the number of leads or lead configuration.

As discussed above, the present invention provides many advantages over conventional packaging technology. Such advantages include enhanced noise reduction and the provision of a semiconductor die carrier handling high frequency signals in the absence of signal degradation, occupying reduced amounts of area, and being capable of meeting the needs of existing and contemplated semiconductor and computer technology. The advantages provided by the present invention over conventional packaging technology illustrate that the present invention, unlike conventional packaging technology, is capable of keeping pace with the rapid advances that are currently taking place in the semiconductor and computer technologies.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and example be considered as exemplary only, with a true scope and spirit of the invention being indicated by the following claims.

What is claimed is:

1. A semiconductor die carrier comprising:
   a module for housing a semiconductor die, said module comprising a top, a bottom, and a plurality of planar outer side surfaces;
   a row of electrically conductive leads extending from at least one of said outer side surfaces of the module, the row of leads comprising a plurality of adjacent leads;
   a semiconductor die housed within the module; and
   at least one high frequency capacitor secured to the module for facilitating transmission of high frequency signals carried to and from the semiconductor die on the electrically conductive leads, wherein the at least one capacitor comprises a capacitive component secured to at least a first pair of the adjacent leads at the at least one outer side surface of the insulative module and wherein at least a second pair of the adjacent electrically conductive leads are separated by only air.

2. The semiconductor die carrier according to claim 1, wherein the capacitive component comprises means for providing physical support to at least one of the adjacent conductive leads.

3. The semiconductor die carrier according to claim 1, wherein each of said leads comprises a horizontally extending section and a vertically extending section joined to said horizontally extending section.

4. The semiconductor die carrier according to claim 3, wherein a cross section taken perpendicular to and through a longitudinal axis of at least one of the leads, and through only one of said vertically and horizontally extending sections of said at least one lead, has a height and a width, the height being greater than the width.

5. The semiconductor die carrier according to claim 1, wherein said capacitive component comprises a capacitive epoxy.

6. A semiconductor die carrier comprising:
   a module for housing a semiconductor die, the module having outer top and bottom surfaces and outer side surfaces joining the outer top and bottom surfaces;
   at least two rows of electrically conductive leads extending from one of said outer side surfaces of said module, each of the rows of leads having a first end lead and a second end lead, wherein each of the first end leads has an outer surface and an inner surface opposite the outer surface, the inner surface facing an adjacent lead in the same row and the outer surface facing away from the rows of leads, and wherein each of the second end leads has an outer surface and an inner surface, the inner surface of the second end lead facing an adjacent lead in the same row and the outer surface of the second end lead facing away from the rows of leads; and
   a high frequency capacitor for facilitating transmission of high frequency signals carried to and from the semiconductor die on the electrically conductive leads, wherein the capacitor is disposed at one of said outer side surfaces of the module and couples the outer surfaces of the first end leads.

7. The semiconductor die carrier according to claim 6, further comprising a second high frequency capacitor for facilitating transmission of high frequency signals carried to and from the semiconductor die on the electrically conductive leads, wherein the second capacitor is disposed at one of said outer side surfaces of the module and couples the outer surfaces of the second end leads.

8. The semiconductor die carrier according to claim 6, wherein each of said leads comprises a substantially horizontal section and a substantially vertical section coupled to said substantially horizontal section.

9. The semiconductor die carrier according to claim 8, wherein a cross section taken perpendicular to and through a longitudinal axis of at least one of the leads, and through only one of said substantially vertical and horizontal sections of said at least one lead, has a height and a width, the height being greater than the width.

10. A semiconductor die carrier comprising:
    a module for housing a semiconductor die, said module comprising a top, a bottom, and a plurality of planar outer side surfaces;
    a row of electrically conductive leads extending from one of said side surfaces of the module, the row of leads comprising a plurality of adjacent leads;
    a semiconductor die housed within the module; and
    at least one high frequency capacitor secured to the module for facilitating transmission of high frequency signals carried to and from the semiconductor die on the electrically conductive leads, wherein the at least one capacitor is sandwiched between at least a first pair of the adjacent leads, and wherein at least a second pair of the adjacent leads are separated by only air.

* * * * *

UNITED STATES PATENT AND TRADEMARK OFFICE
CERTIFICATE OF CORRECTION

PATENT NO. : 5,821,457
DATED : Oct. 13, 1998
INVENTOR(S) : Mosley et al.

It is certified that error appears in the above-identified patent and that said Letters Patent is hereby corrected as shown below:

Title page, item [63] "Related Application" field, delete ", abandoned" after "1994".

Signed and Sealed this

Sixth Day of June, 2000

Attest:

Q. TODD DICKINSON

*Attesting Officer*      *Director of Patents and Trademarks*